US007851109B2

(12) United States Patent
Chakravorty et al.

(10) Patent No.: US 7,851,109 B2
(45) Date of Patent: Dec. 14, 2010

(54) LOW STRESS PELLICLE FRAMES AND RETICLE PELLICLE ASSEMBLIES

(75) Inventors: Kishore K. Chakravorty, San Jose, CA (US); Frank E. Abboud, Pleasanton, CA (US); Henry Yun, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 305 days.

(21) Appl. No.: 12/060,220

(22) Filed: Mar. 31, 2008

(65) Prior Publication Data

US 2009/0246644 A1    Oct. 1, 2009

(51) Int. Cl.
*G03F 1/00* (2006.01)

(52) U.S. Cl. .......................................................... 430/5
(58) Field of Classification Search .................... 430/5; 428/14

See application file for complete search history.

(56) References Cited

U.S. PATENT DOCUMENTS

| 6,359,718 | B1 | 3/2002 | Lin et al. | |
|---|---|---|---|---|
| 6,797,439 | B1* | 9/2004 | Alpay | 430/5 |
| 7,298,458 | B2 | 11/2007 | Berman et al. | |
| 2004/0194556 | A1 | 10/2004 | Shu et al. | |
| 2006/0146313 | A1 | 7/2006 | Gallagher et al. | |
| 2007/0264582 | A1 | 11/2007 | Chang et al. | |

* cited by examiner

*Primary Examiner*—Stephen Rosasco
(74) *Attorney, Agent, or Firm*—Blakely, Sokoloff, Taylor & Zafman LLP

(57) ABSTRACT

Low stress reticle pellicle assemblies. In accordance with certain embodiments of the present invention, a pellicle frame of reduced stiffness is employed to reduce the stress a pellicle frame induces in a reticle plate. In other embodiments, a pellicle frame of reduced adhesive surface is employed to reduce the stress a pellicle frame induces in a reticle plate. In accordance with still other embodiments, a stress compensating frame is employed to reduce the cumulative stresses in an assembly comprising the reticle plate, pellicle and stress compensating frame.

20 Claims, 5 Drawing Sheets

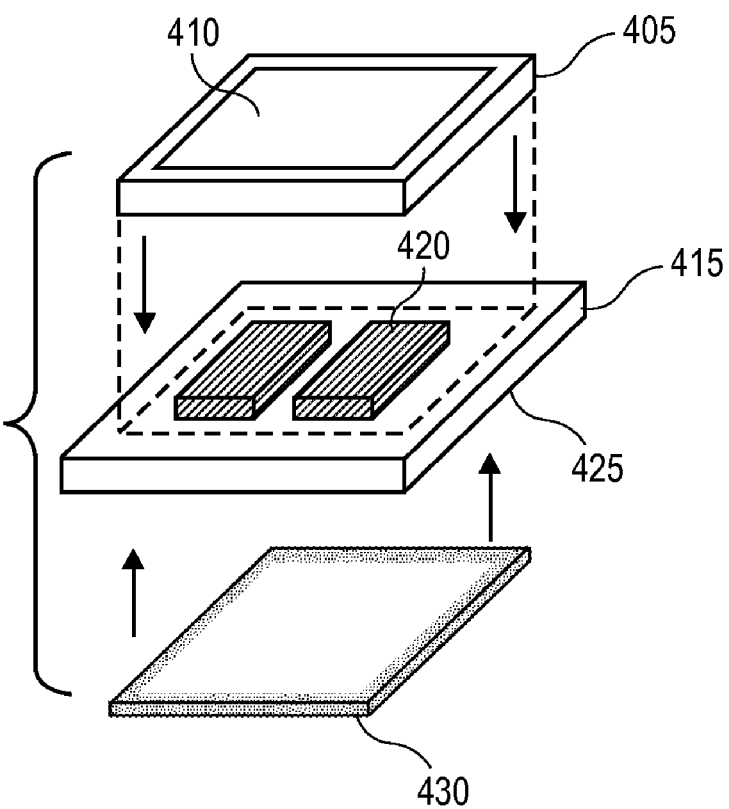
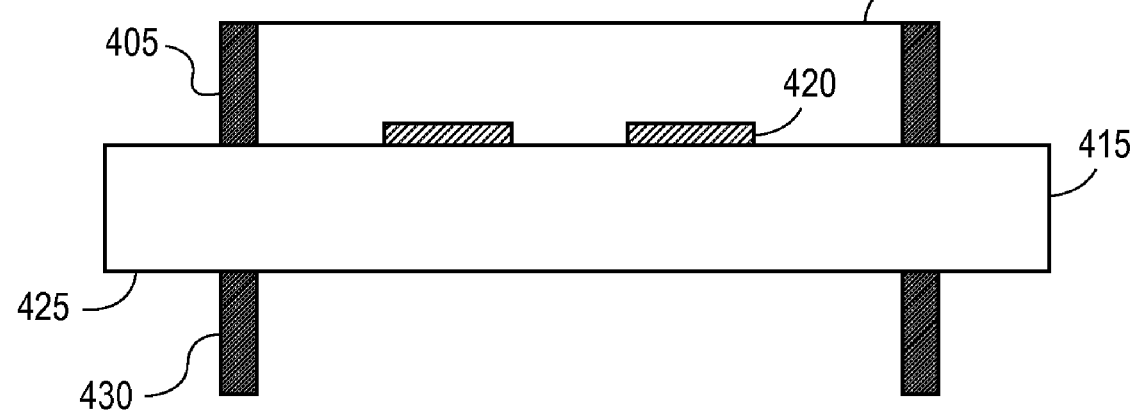

LOW STRESS PELLICLE FRAMES AND RETICLE PELLICLE ASSEMBLIES

TECHNICAL FIELD

The invention is in the field of semiconductor devices, more specifically pertaining to pellicles for lithographic reticles.

BACKGROUND

Lithographic reticles are employed for patterning substrate areas to be etched, such as to create a gate electrode of transistor. A "reticle," as shown in FIG. 1 is a hard copy of the pattern to be imaged created in a thin layer of an opaque material, such as chrome 120, deposited on a glass or quartz reticle plate 115. The reticle may be used to image the pattern onto a semiconductor substrate. Alternatively, the reticle may be used to produce another reticle or photomask.

Pellicles are employed on the patterned (chrome) side of the mask to prevent propagation of particle-related defects into patterns imaged onto the substrate. Generally, a pellicle includes a pellicle membrane 110, transparent to the lithographic radiation, which covers the chrome 120 at an elevation defined by a pellicle frame 105 to keep particles out of depth of focus. Particles which land on the pellicle membrane 110 or on the back side of the mask 125 contribute little to the patterning process since they are not within the object plane of the imaging system. Pellicle membranes 110 may be either of "soft" polymer-based materials on the order of 1 um thick or "hard" silica-based materials. Pellicle frame 105 is typically a metal, such as anodized aluminum, which can be relatively inexpensively machined and kept clean during use. The pellicle frame 105 includes a perimeter of walls which are attached by an adhesive to a chrome side of the reticle plate 115. Typically, the frame 105 is a solid forming a simple rectangular cross-sectional area, as depicted.

The lithographic process may be characterized with an amount of pattern displacement from the desired location, referred to as a registration error. As depicted in FIG. 1, the mounting of the pellicle frame 105 can alter the flatness of plate 115 by exerting mechanical stresses on the mask. This non-flatness induced by the mounting of the pellicle frame 105 to reticle plate 115 may induce registration error by changing where a pattern in chrome 120 is imaged onto a substrate. For example, articles have described how pellicles can affect the shape of the mask as a function of initial pellicle flatness and temperature change (Cotte et al., Experimental and Numerical studies of the Effects of Materials and Attachment Conditions on Pellicle-Induced Distortions in Advanced Photomasks, SPIE Vol. 4754, pp. 579-588 (2002)). While some amount of symmetrical distortion of reticle plate 115 may be cancelled with correction algorithms employed during substrate imaging, flatness of the pellicle frame 105 as well as the mounting process may induce asymmetrical distortion, whereby plate 115 warps in one dimension by a first amount and warps in a second dimension by a second amount. Furthermore, unless the distortion induced is highly repeatable, plate-specific correction algorithms require accurate measurement of plate distortion.

As the amount of registration error tolerable generally scales with feature resolution, the magnitude of registration error induced by the pellicle has become a critical path in the continued scaling of photo lithography.

BRIEF DESCRIPTION OF THE DRAWINGS

Embodiments of the present invention are illustrated by way of example, and not limitation, in the figures of the accompanying drawings in which:

FIG. 4A illustrates an isometric view of assembling a pellicle frame and stress compensation frame on opposing surfaces of a reticle, in accordance with one embodiment;

FIG. 4B illustrates a cross-sectional view of the assembly of FIG. 4A comprising a pellicle frame and a stress compensation frame on opposing surfaces of a reticle, in accordance with one embodiment;

DETAILED DESCRIPTION

Figure 1:
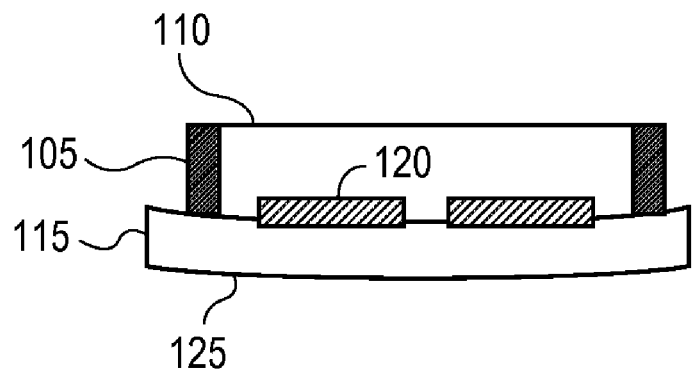
FIG. 1 illustrates a cross-sectional view of a conventional pellicle mounted on a reticle inducing distortion in reticle.

Embodiments of low stress pellicle frames and low stress reticle pellicle assemblies are described herein with reference to figures. In accordance with certain embodiments of the present invention, a pellicle frame of reduced stiffness is employed to reduce the stress a pellicle frame induces in a reticle plate. In other embodiments, a pellicle frame of reduced adhesive surface is employed to reduce the stress a pellicle frame induces in a reticle plate. In accordance with still other embodiments, a stress compensating frame is employed to improving the flatness of an assembly comprising the reticle plate, pellicle and stress compensating frame.

However, particular embodiments may be practiced without one or more of these specific details, or in combination with other known methods, materials, and apparatuses. In the following description, numerous specific details are set forth, such as specific materials, dimensions and material parameters etc. to provide a thorough understanding of the present invention. In other instances, well-known design and fabrication techniques have not been described in particular detail to avoid unnecessarily obscuring the present invention. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, materials, or characteristics may be combined in any suitable manner in one or more embodiments.

The terms "over," "under," "between," and "on" as used herein refer to a relative position of one member with respect to other members. As such, for example, one member disposed over or under another member may be directly in contact with the other member or may have one or more intervening members. Moreover, one member disposed between members may be directly in contact with the two members or may have one or more intervening members. In contrast, a first member "on" a second member is in contact with that second member. Additionally, the relative position of one member with respect to other members is provided assuming operations are performed relative to a reticle plate without consideration of the absolute orientation of the reticle plate.

It has been found that attaching a conventional pellicle frame to a reticle may induce an average registration 3 standard deviation distortion of 8 nm or more. A significant portion of this misregistration has been further determined to be attributable to the mechanical aspects of the pellicle frames.

Generally, particular embodiments disclosed herein provide for a relatively more compliant frame that distorts under application of the assembly load, straining under the applied stress without imparting stress on the reticle plate to the extent of a conventional pellicle frame. Because compliant frames impart significantly smaller magnitudes of distortion in the reticle plates, compliant frames advantageously reduce the need to create ultra flat pellicle frames. Expensive operations capable of providing ultra flat surfaces are thereby limited to reticle plate manufacturing. Furthermore, compliant pellicle frames enlarge the pellicle mounting process window because irregularities in mount pressure, loader configuration, etc. are absorbed through strain of the compliant pellicle frame rather than strain of the reticle plate.

Certain of these embodiments modify the geometry of a pellicle frame relative to that of a conventional pellicle frame to reduce frame stiffness for a given frame material. For example, portions of the frame members may be constructed with reduced cross sectional area for a given adhesive surface area to better absorb stress loads. Certain other of these embodiments modify the geometry of a pellicle frame relative to that of a conventional pellicle frame to reduce the adhesive surface contact area of the frame for a given frame member material. Because it has been found that irregularities in pellicle frame surfaces adhered to a reticle plate induce localized distortions in the reticle plate, pellicle frames having a reduced adhesive surface area may impart less distortion in the reticle plate. For example, portions of the frame members may be constructed to be set off from the reticle plate by one or more contact pads of a smaller surface area than the width of a frame member multiplied by the length of a frames member.

In still other of these embodiments, the stiffness of the frame is reduced by employing a material of a lower elastic modulus for the pellicle frame for any given geometry. For example, a material having an elastic modulus significantly lower than that of the conventional anodized aluminum pellicle frame may be chosen. In a further embodiment, the elastic modulus of the adhesive layer may further buffer the stress load in a strained pellicle frame from a reticle plate.

Particular other embodiments disclosed herein provide for a stress compensating member to be attached to a glass side of a reticle plate to reduce the aggregate stress applied to the reticle plate and/or improve the final flatness of the reticle plate in the final pellicle-reticle assembly. For example a stress compensating frame of a similar geometry and material as that of the pellicle frame adhered to the chrome side of the reticle plate may be adhered the glass side of the pellicle frame. In such embodiments, rather than minimizing the stress imparted by the pellicle frame on the reticle plate, a counter stress is imparted on the reticle plate from an opposite direction to neutralize at least some of the stress imparted by pellicle frame. In some such embodiments, the stress compensating member may comprise a frame which may be adjusted to impart a given level of counter stress to specific regions of the reticle plate. Such embodiments offer the advantage of being able to improve upon the level of flatness of a reticle plate in the final pellicle-reticle assembly whether the plate distortion is a result of mounting a pellicle frame, the result of plate manufacturing tolerances, or even secondary effects like gravitational sag.

Though each embodiment is discussed herein substantially in turn, it should be appreciated that further advantages may be had by employing any number of these embodiments in combination. For example, localized distortions may be reduced by employing a pellicle frame with reduced adhesive surface contact area while global distortions induced by such a pellicle frame may be reduced by a stress compensating frame, having a similar adhesive surface contact area. As another example, a pellicle frame may comprise a compliant material and also have a reduced adhesive surface to reduce both local and global distortions of the reticle plate.

Generally, pellicle frame dimensions may vary for a given reticle size. As an example, referring to FIG. 2A, the pellicle frame 205 may have a perimeter length, L, and perimeter width, W, each on the order of a few inches, and a frame width, d, of between approximately 2 mm and 5 mm. The pellicle frame sidewall height, $h_s$, may be between approximately 3 mm and 8 mm, as depicted in the cross-sectional view of FIG. 2B, taken along the a-a' plane denoted in the plan view of FIG. 2A.

In certain embodiments, the geometry of a pellicle frame is reduced below the conventional solid rectangular area cross-sectional area of frame width, d, multiplied by frame sidewall height, $h_s$ to reduce the overall stiffness of the pellicle frame. In certain such embodiments, voids are formed in the pellicle frame members. The voids may then been filled with a highly compliant material or left as free space. In certain of these embodiments, the foot print of pellicle frame is equal to d*(2L+2W), essentially equal to the foot print of a conventional pellicle frame. Maintaining a foot print equal to that of a conventional pellicle frame advantageously allows existing layout and mounting equipment to be employed with little modification. Performance of existing mounting processes remains substantially unchanged for the new geometries because the mounting pressure transmitted by the pellicle frame 205 to a reticle plate remains substantially the same.

Figure 2A:
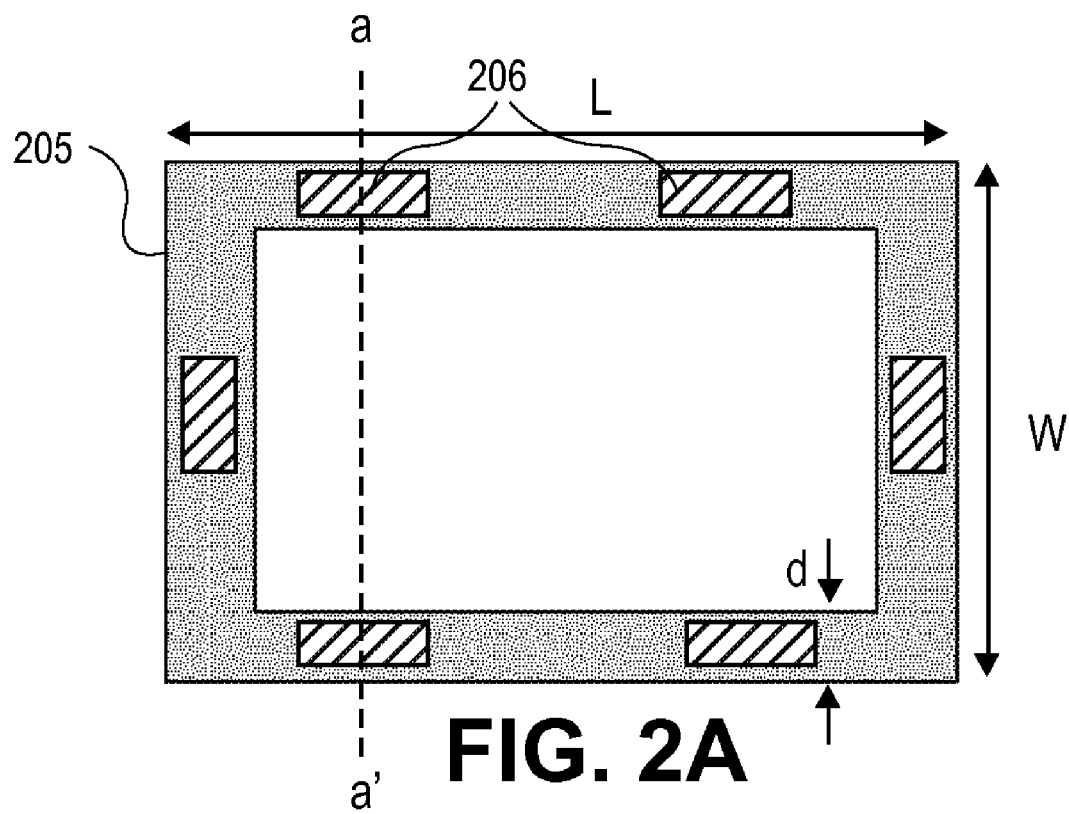
FIG. 2A illustrates a plan view of a pellicle frame with a reduced stiffness, in accordance with one embodiment.
Figure 2B:
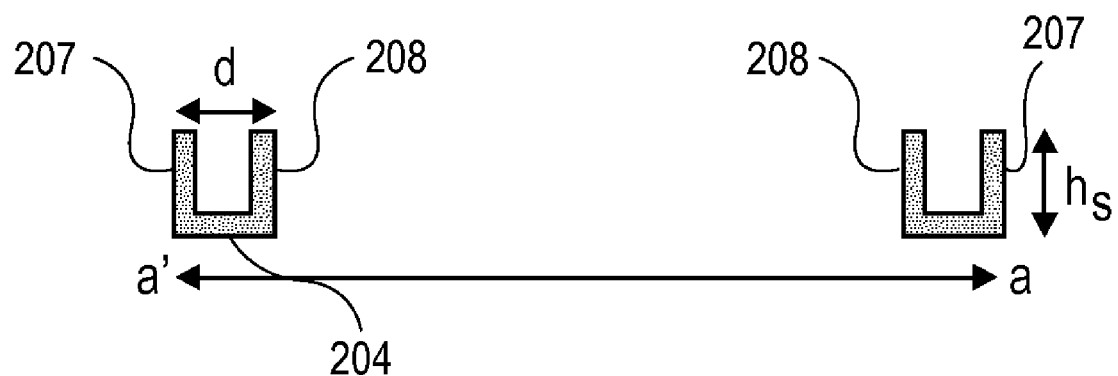
FIG. 2B illustrates a cross-sectional view of the pellicle frame depicted in FIG. 2A as viewed from the plane a-a', in accordance with one embodiment.

One exemplary implementation is shown in the embodiment depicted in FIGS. 2A and 2B. Recessed regions 206 are formed in the pellicle frame 205. Referring to FIG. 2B, the recessed regions 206 reduce the thickness of a portion of the frame perimeter (L or W) by some amount less than the frame sidewall height, $h_s$. As further shown in FIG. 2B, the recessed regions 206 reduce the thickness of a portion of the frame width, d, such that at least an outer perimeter sidewall 207 or inner perimeter sidewall 208 is maintained at the sidewall height, $h_s$. As such, the recessed regions 206 result in a portion of the frame 205 perimeter length having a "U" shaped cross-section, as depicted in FIG. 2B. In other embodiments, one of the inner perimeter sidewall 208 or outer perimeter sidewall 207 is also eliminated, resulting in an "L" shaped cross-section along the a-a' plane. In one such embodiment, the portion of the pellicle frame perimeter length having the "L" or "U" shaped cross-section is substantially shorter than a perimeter length of the frame to confine deformation to a target region formed in the pellicle frame upon application of a stress. For example, the length of the recessed region may be on the order of the frame width, d.

These exemplary implementations provide both a pellicle frame footprint and pellicle membrane offset substantially unchanged from conventional pellicle frame geometry, but with significantly reduced frame stiffness. These exemplary implementations further provide a continuous sealing edge along an outer perimeter of the pellicle frame 205 at the bottom frame surface 204, to which an adhesive may be applied for mounting the pellicle frame 205 to a reticle plate to advantageously prevent particles from landing a chrome side of a reticle plate.

The dimension and number of recessed regions 206 may be dependent on the material chosen for the bulk of the pellicle frame. For example, a frame material of high elastic modulus may employ a greater number of recesses or require recesses of larger dimension (i.e. recessed regions 206 become a greater portion of the pellicle frame 205) than does a frame material of lower elastic modulus. In one embodiment, the recessed regions 206 span the entire pellicle frame perimeter length of 2L+2W. In another embodiment, a ratio of recessed regions 206 to perimeter length (2L+2W) is less than 75%. For a particular embodiment employing an anodized aluminum frame with a elastic modulus of approximately 60-70 giga-pascal (GPa), the perimeter length of the recessed regions 206 is between approximately 25% and 75%. In other embodiments, the pellicle frame 205 may comprise materials, such as, but not limited to stainless steel and the perimeter length of the recessed regions 206 is between approximately 25% and 50%. Furthermore, the recessed locations 206 may be located along any portion of a member forming the pellicle frame 205. For example, centered along the members spanning the frame perimeter width, W, or perimeter length, L. In an alternate embodiment, recessed locations 206 may be located proximate to the corners of a pellicle frame.

Figure 2C:
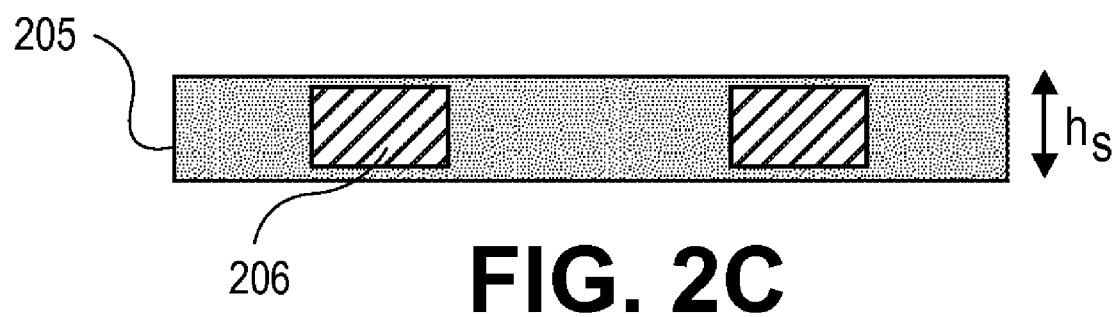
FIG. 2C illustrates a side view of a pellicle frame with a reduce stiffness, in accordance with an embodiment.

In further embodiments, the geometry of a pellicle frame relative to that of a conventional pellicle frame is modified to reduce the adhesive surface contact area of the frame for a given frame member material. Such an embodiment is depicted in the cross-sectional view of FIG. 3A and may be considered a recess formed in a bottom surface 304 of a pellicle frame member 305, rather than the recessed regions 206 formed in a top surface or sidewall surface of the pellicle frame as in the embodiments of FIGS. 2A and 2C, respectively. As such, the recessed region formed in the pellicle frame member 305 reduces the area of the pellicle frame that will make contact with a reticle plate when removably attached, typically by an adhesive layer applied to the bottom surface 304. In this embodiment, the overlap area of the pellicle frame to pellicle membrane may remain substantially as that of a pellicle with conventional geometry.

Figure 3A:
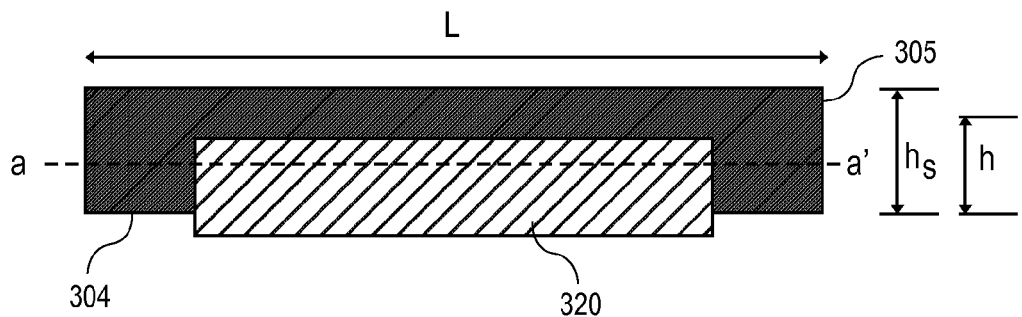
FIG. 3A illustrates a side view of a pellicle frame with a reduced stiffness and a reduced adhesive surface, in accordance with one embodiment.
Figure 3B:
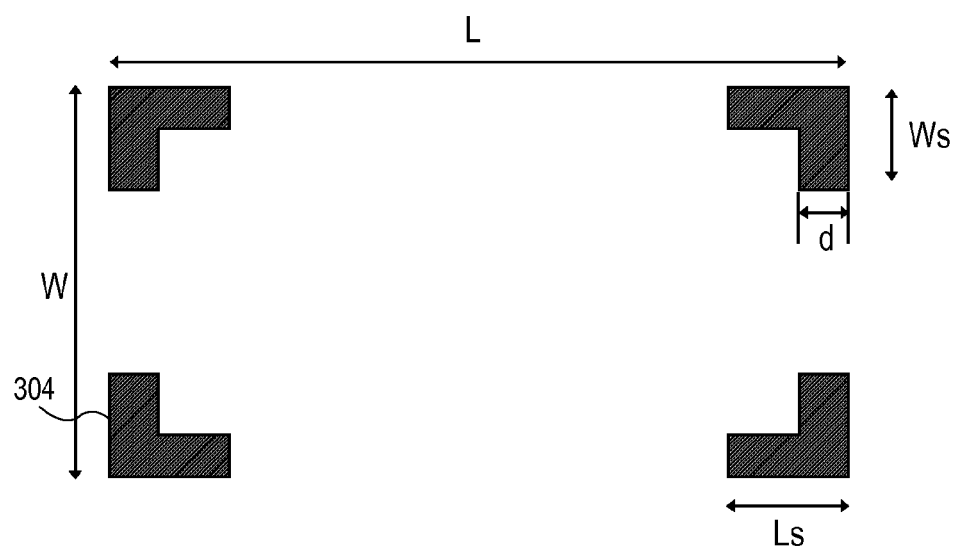
FIG. 3B illustrates a cross-sectional view of a pellicle frame as viewed from the plane a-a' identified in FIG. 3A, in accordance with one embodiment.
Figure 3C:
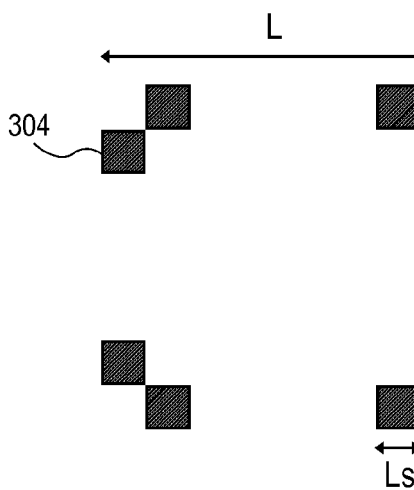
FIGS. 3C-3D illustrates a cross-sectional view of a pellicle frame as viewed from the same perspective of 3B, in accordance with one embodiment.
Figure 3D:
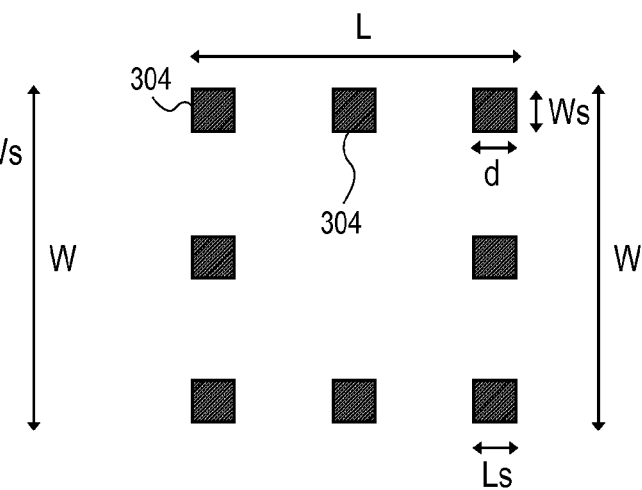

As depicted in FIG. 3A, the bottom surface 304 remaining, after a portion of the bottom surface of pellicle frame member 305 is recessed, forms a contact surface "pad" or "foot" of sidewall height, $h_s$, while the remaining span of the frame perimeter length, L, is of a lesser height, h. As further shown in the cross-sectional view of FIG. 3B, taken along the plane a-a' plane denoted in FIG. 3A, width of the contact surface, $W_s$, is only a fraction of the pellicle frame perimeter width, W. Similarly, the length of the contact surface, $L_s$, is only a fraction of the pellicle frame perimeter length, L. In particular embodiments, the contact surface $L_s$, is less than 75% of the perimeter length, L, with Ws at a similar percentage of W, such that the total perimeter length of the contact pad is less than 75% of the total perimeter, L+W. Furthermore, it should be appreciated the reduce pellicle frame total perimeter length, L+W may be implemented in various fashions. For example, as shown in FIGS. 3C and 3D, the shape or the post forming the "pad" providing a bottom surface 304 may be simply a square of a dimension so that $L_s$ and $W_s$ are approximately equal to the frame width d. As further shown in FIG. 3D, additional support posts may be present in the perimeter length, L, and/or perimeter width, W, between corners of the reticle frame 305. Thus both the number and dimension of the posts may be modified to provide a bottom surface 304 spanning less than 75% of the total frame perimeter length. In a further embodiment, the dimension of the recessed portion of the bottom. In a further embodiment, the pellicle frame recessed is substantially shorter than a perimeter length of the frame to confine deformation to a target region of the pellicle frame upon application of a stress.

This reduced area of the contact pad 304 may serve to increase the local force for a given pressure applied by a pellicle mounting process such that the magnitude of the applied mounting pressure may be advantageously reduced. Also, similar to embodiments discussed elsewhere herein, converting a portion of the frame cross-section (sidewall height reduced) to void space reduces the stiffness of the pellicle frame for a material of a given elastic modulus. Furthermore, the reduced contact pad area reduces the reticle plate area subjected to frame attachment induced local distortion (e.g. local distortion of the reticle frame occurs over a adhesion length substantially less than the frame perimeter length, L+W). For example, it has been experimentally determined that a residual registration three standard deviation distortion mean value of approximately 10 nm for aluminum pellicle frames of conventional geometry may be reduced to less than approximately 3 nm when the aluminum pellicle frames are modified to a four corner post geometry, such as that depicted in FIGS. 3A and 3B.

As further shown in FIG. 3A, a reduction in the contact surface area opens a portion of the pellicle frame sidewall about the perimeter length, L, thereby potentially allowing particles to contaminate chrome surfaces. Therefore, in particular embodiments employing a reduced contact surface area pellicle frame, a second material 320 covers a recess opening along in the perimeter length, L. Second material 320 may be a more compliant material the pellicle frame member 305 so that no significant stress is imparted to a reticle plate by the second material 320. In particular embodiments, second material 320 is not to be adhered to a surface of a reticle plate, but instead merely abutted to the reticle plate (e.g. by extending slightly beyond the bottom surface 304, as depicted in FIG. 3A). In one exemplary implementation, second material 320 may be in the form of a membrane wrapped about, or attached to, an outer or inner perimeter sidewall of the pellicle frame member 305 (e.g. forming an outer frame sidewall or inner frame sidewall). The membrane material should have a low degas rate and generate few particulates. The membrane material may be substantially the same material employed for the pellicle membrane overlying the chrome side of the pellicle plate and may further comprise a portion of a same continuous polymer sheet as a the pellicle membrane. In other embodiments, however, because radiation transparency is not necessary and may even be disadvantageous, second material 320 may be an opaque membrane of different composition and/or thickness than the pellicle membrane. In still another implementation, the openings in the frame sidewalls may be covered with a member attached such that it can move along an axis parallel to the pellicle frame sidewall so as to flush with a reticle surface when mounted.

In another embodiment, to reduce reticle plate distortion, the stiffness of a pellicle frame is reduced by employing a material with an elastic modulus well below that of a conventional pellicle frame for any given frame geometry. For example, a material having an elastic modulus significantly lower than that of the conventional anodized aluminum pellicle frame (approximately 60-70 GPa) may be chosen. The frame material should generally be easily formed by a molding process or a machining process and shed few particulates. In one such embodiment, a pellicle frame is formed substantially of a material with an elastic modulus between approximately 200 mega-pascal (MPa) and 10 GPa. In one such embodiment, a pellicle frame consists of polytetrafluoroethylene (PTFE), perfluoroalkoxy (PFA) or fluorinated ethylene propylene (FEP). In still other embodiments, various other plastics may be employed such as low density polyethylene (LDPE), high density polyethylene (HDPE), polycarbonate and polystyrene. In a further embodiment, the elastic modulus of the adhesive layer may further buffer the stress load in a strained pellicle frame from a reticle plate. For example, an adhesive layer applied to the pellicle frame bottom surface may have an elastic modulus of approximately 100 MPa to 3 GPa. In yet another embodiment, the pellicle frame may further comprises a second material having substantially higher elastic modulus than the first material to confine deformation to the portion of the pellicle frame comprising the first material upon application of a stress. One such exemplary implementation, the pellicle frame may include one or more spans of a high elastic modulus material, such as anodized aluminum, with one or more spans of low elastic modulus materials, such as those described above. In such configurations, the low modulus regions form vulnerable locations which can be designed to partially collapse or yield in response to application of a stress, such as during bonding.

Referring now to then embodiment depicted in FIG. 4A, a stress compensating member 430 may be attached to a glass side 425 of a reticle plate 415 to reduce the aggregate stress imparted to the reticle plate 415 by a pellicle frame 405 and pellicle membrane 410 adhered to a chrome side 420. Stress compensation member 430 may be attached prior to, concurrent with, or subsequent of attachment of pellicle frame 405. The adhesion method depicted in FIG. 4A provides a reticle-pellicle-stress compensation member assembly 400 depicted in cross-section in FIG. 4B.

As depicted in FIGS. 4A and 4B, the stress and consequent distortion of the reticle as a result of pellicle frame attachment (and other processes) may be compensated via the symmetric configuration of the pellicle frame 405 and compensation member 430. Any load offered on the chrome side 420 may be symmetrically compensated by the compensation member 430 on the glass side 425. As such, distortion can be reduced and the reticle plate flattened at the completion of the reticle-pellicle fabrication process, whether or not the source of warpage is the pellicle mounting, reticle plate manufacturing tolerances, or even secondary effects like gravitational sag. For example, even were a compliant pellicle 405 is employed and the pellicle frame induced distortion of the reticle plate 415 is minimal, reticle plate 415 may be determined to have an unacceptable level of distortion at a final inspection stage of the reticle-pellicle assembly process. Under such a condition, stress compensation member 430 may be applied to reduce the distortion in reticle plate 415 to an acceptable threshold. In this manner, the glass side 425, otherwise unutilized by the lithographic process, may be manipulated after the chrome 420 is protected by an attached pellicle. Such embodiments have the further advantage of decoupling support of the pellicle membrane 410 from the tuning of a final distortion or strain in the reticle plate 415. Also advantageously, because the stress compensation member 430 need not provide any particulate control, geometric or mechanical configuration and materials selection can be made independently for the express purpose of flattening the reticle plate 415. Furthermore, the stress compensation member 430 may employ relatively "dirty" mechanical or other means of adjusting an induced stress because particles on the glass side 425 are relatively less concerning than on the chrome side 420.

In one particular embodiment, a stress compensation frame adhered the reticle plate glass side is of substantially the same geometry and material as that of the pellicle frame adhered to the chrome side. In such embodiments, a relatively non-compliant pellicle frame 405 and stress compensation member 430 may be employed, such as ones forming a stress compensation frame comprising members of anodized aluminum. In this manner a fixed or static stress may be imparted by the stress compensation member 430 to counter that of the pellicle frame 405.

Figure 5A:
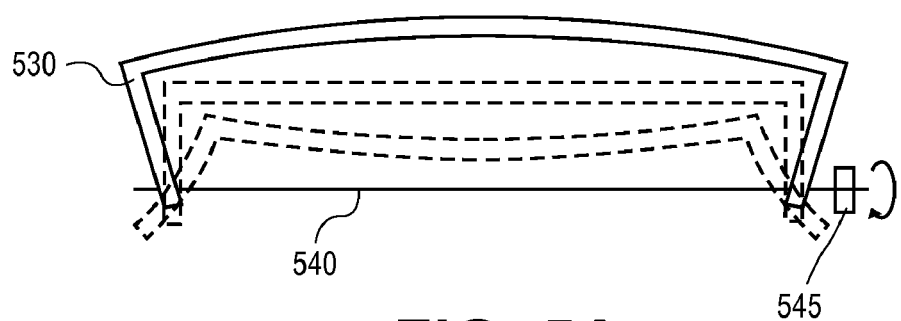
FIG. 5A illustrates a side view of a mechanically adjustable stress compensation member, in accordance with one embodiment.
Figure 5B:
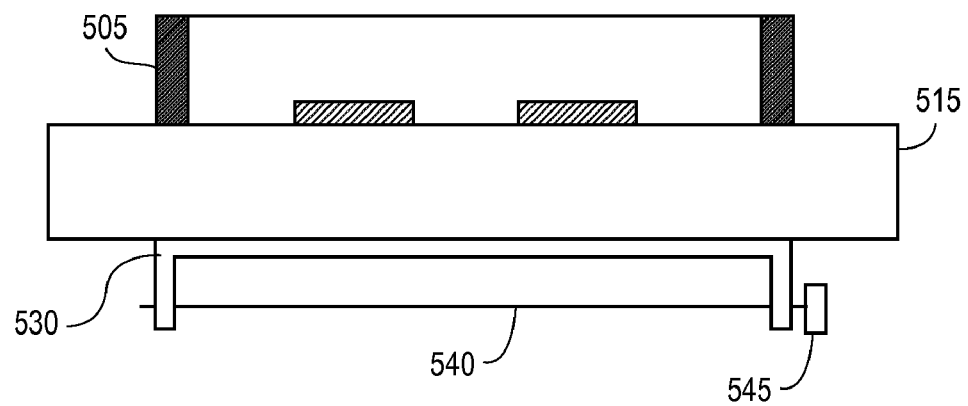
FIG. 5B-5C illustrate a side view and plan view, respectively, of a pellicle-reticle assembly further comprising a mechanically adjustable stress compensation member, in accordance with one embodiment.
Figure 5C:
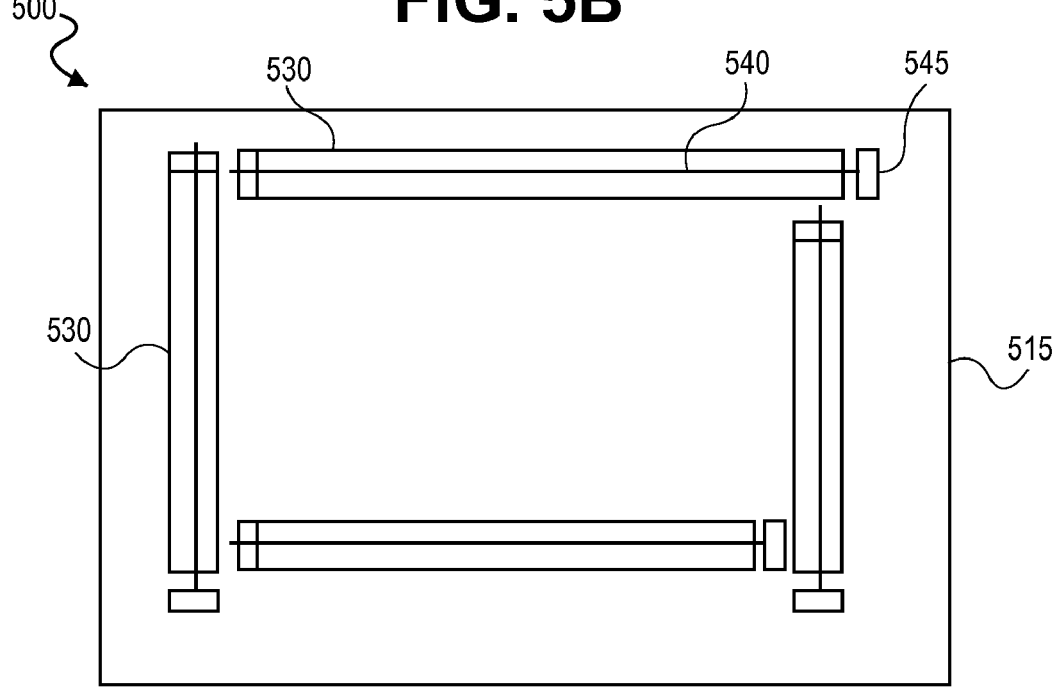

In other embodiments, the stress compensation member may be adjustable. In one such embodiment, the stress compensation member 430 may be adjusted mechanically, as depicted in FIG. 5A through FIG. 5C. FIG. 5A, depicts a side view of an adjustable stress compensation member 530 which may be strained by flexing with a turning of the compression fitting 545 attached to screw 540. In certain embodiments, stress compensation member 530 may be formed to have a preloaded strain. As shown in FIG. 5B, the adjustable stress compensation member 530 may be adhered to the glass side of the reticle plate 515, before or after pellicle frame 505 is attached to the chrome side, to form a reticle-pellicle assembly. A plan view lithographic reticle-pellicle assembly 500 from the glass side of reticle plate 515 is depicted in the FIG. 5C. As shown, an adjustable stress compensation frame may comprise a plurality of adjustable stress compensation members 530, each of which may be mechanically adjusted before or after assembling the pellicle-reticle to compensate strain in the reticle plate 515 and thereby improve the flatness of the reticle plate 515. Each adjustable stress compensation member 530 may be decoupled from adjacent adjustable stress compensation members, as depicted, or the plurality configured into a contiguous frame. Once the adjustable stress compensation members 530 are adhered to the reticle plate 515 in any orientation, a measurement of reticle plate flatness may be performed with conventional techniques and the results of which may be entered into a model to determine the number of turns the compression fitting 545 of each adjustable stress compensation member 530 requires to compensate components of the measured distortion.

In another embodiment, the adjustable stress compensation member 530 may be adjusted thermally to impart a given level of counter stress to specific regions of the reticle plate. For example, the stress compensation member 530 may include a material of different coefficient of thermal expansion (CTE) than reticle plate 515, to induce a first amount of stress in the adjustable stress compensation member 530 as the member is heated to known temperature prior to attaching the adjustable stress compensation member 530 to the glass side of reticle plate 515. Upon cooling to room temperature, the attached adjustable stress compensation member 530 contracts more or less than the reticle plate 515 to induce a compensating strain in the reticle plate 515 and improve flatness. It should be appreciated, that screw 540 need not be present in thermally adjustable stress compensation member 530 if additional mechanical adjustment is not desired.

As shown in FIG. 5C, each adjustable stress compensation member 530 may be physically separated from adjacent adjustable stress compensation members to enable independent heating of each of the plurality of members. Since the stress compensation member 530 need not provide contiguous a particulate barrier, each member of a plurality may be independently positioned to compensate components of reticle distortion. Commonly known materials for which the CTE is well characterized may be employed to effect a controlled stress across various stress compensation members 530 to strain the reticle plate 515 and the pellicle frame 505 by an amount sufficient to improve the flatness of the reticle plate 515 when part of the pellicle-reticle-stress compensation assembly.

In yet another embodiment, the adjustable stress compensation member 530 may comprise a piezoelectric material by which its dimensions may be adjusted by an applied electric field to impart a given level of counter stress to specific regions of the reticle plate. In such an implementation, commonly known piezoelectric materials may be employed. Here too, the adjustable stress compensation member 530 incorporating a piezoelectric material may, but need not, further include a mechanical adjustment, such as the depicted screw 540 and compression fitting 545. In practice, an electric voltage may be applied to an individual adjustable stress compensation member 530 prior to attaching it to the reticle plate 515. After attachment, removal of the applied voltage then induces a dimensional change to compensate a distortion of the reticle plate 515.

Thus, low stress pellicle frames and low stress reticle-pellicle assemblies have been disclosed. One or more of the embodiments described in detail may be employed to reduce an amount of distortion in a reticle plate and thereby reduce registration errors. Although the present invention has been described in language specific to structural features or methodological acts, it is to be understood that the invention defined in the appended claims is not necessarily limited to the specific features or acts described. The specific features and acts disclosed are to be understood as particularly graceful implementations of the claimed invention in an effort to illustrate rather than limit the present invention.

What is claimed is:

1. A lithographic reticle pellicle comprising:
a pellicle membrane; and
a pellicle frame to support the pellicle membrane, wherein the pellicle frame comprises a first material having an elastic modulus between approximately 200 MPa and 10 GPa, wherein the pellicle frame further comprises a second material having substantially higher elastic modulus than the first material to confine deformation to the portion of the pellicle frame comprising the first material upon application of a stress.

2. The lithographic reticle pellicle as in claim 1, wherein the first material is selected from the group consisting of: PTFE, PFA and FEP.

3. The lithographic reticle pellicle as in claim 1, wherein the pellicle frame further comprises an adhesive on a bottom surface to be attached to a reticle, wherein the adhesive has an elastic modulus between approximately 100 MPa and 3 GPa.

4. The lithographic reticle pellicle as in claim 1, wherein the second material has an elastic modulus between approximately 60-70 GPa.

5. A lithographic reticle pellicle comprising:
a pellicle membrane; and
a pellicle frame to support the pellicle membrane, the pellicle frame comprising at least one frame member having a bottom surface of a width to face a reticle and a first sidewall surface, normal to the bottom surface, of a height to elevate the pellicle membrane from the bottom surface, wherein along at least a portion of the pellicle frame member length, the pellicle frame member cross-section is "L" shaped with a cross-sectional area less than the bottom surface width multiplied by the sidewall height.

6. The lithographic reticle pellicle as in claim 5, wherein the pellicle frame member further includes a second sidewall surface, opposite the first sidewall surface, with a void there between to form a "U"-shaped cross-section along at least a portion of the pellicle frame perimeter length.

7. The lithographic reticle pellicle as in claim 5, wherein the first sidewall surface of the pellicle frame member forms a portion of an inner perimeter of the pellicle frame.

8. The lithographic reticle pellicle as in claim 5, wherein the pellicle frame member comprises a metal selected from the group consisting of: aluminum and stainless steel.

9. The lithographic reticle pellicle as in claim 5, the portion of the pellicle frame perimeter length having the "L" shaped cross-section is substantially shorter than a perimeter length of the frame to confine deformation to a narrow region of the pellicle frame upon application of a stress.

10. The lithographic reticle pellicle as in claim 5, wherein the pellicle frame member further includes a second sidewall surface, opposite the first sidewall surface, to form a "U"-shaped cross-section along at least a portion of the pellicle frame perimeter length with a compliant material disposed between the opposing frame member sidewalls, the compliant material having a substantially lower elastic modulus that the frame member.

11. A lithographic reticle pellicle comprising:
a pellicle membrane; and
a pellicle frame to support the pellicle membrane, wherein a first portion of a bottom surface along an outer perimeter length of the pellicle frame is recessed about the entire frame width so that only a second portion of the bottom surface along the outer perimeter length provides an adhesion contact surface to be adhered to a reticle.

12. The reticle pellicle as in claim 11, wherein the second portion of the bottom surface has a perimeter length less than 75% of the perimeter length of the pellicle frame.

13. The reticle pellicle as in claim 11, further comprising a sidewall membrane attached to an outer sidewall of the pellicle frame to substantially cover the recess in the pellicle frame.

14. The reticle pellicle of claim 13, wherein a bottom edge of the sidewall membrane is to contact the reticle when the second portion of the bottom pellicle surface is adhered to the reticle.

15. The reticle pellicle as in claim 11, wherein the first portion of the bottom surface of the pellicle frame recessed is substantially shorter than a perimeter length of the frame to confine deformation to a target region of the pellicle frame upon application of a stress.

16. A lithographic reticle-pellicle assembly comprising:
a reticle with a chrome side and a back side, opposite the chrome side;
a pellicle frame with a pellicle membrane spanning an area defined by the pellicle frame, the pellicle frame attached to the chrome side of the reticle; and a stress compensation member attached to the back side of the reticle, wherein the stress compensation member is a frame comprising substantially the same material and with substantially the same physical dimensions as the pellicle frame.

17. The lithographic reticle-pellicle assembly as claimed in claim 16, wherein the stress compensation member is adjustable by modifying a strain on a surface of the stress compensation member attached to the back side of the reticle.

18. The lithographic reticle-pellicle assembly as claimed in claim 17, wherein the strain in the stress compensation member is mechanically adjusted by flexing the stress compensation member.

19. The lithographic reticle-pellicle assembly as claimed in claim 18, wherein the stress compensation member is mechanically adjusted with a screw spanning the stress compensation member.

20. The lithographic reticle-pellicle assembly as claimed in claim 16, wherein the stress compensation member has a different CTE than the reticle to thermally adjust the compensating stress induced by the stress compensation member on the reticle.

* * * * *